United States Patent
Cho et al.

(10) Patent No.: US 10,108,036 B2
(45) Date of Patent: Oct. 23, 2018

(54) DISPLAY DEVICE INCLUDING CURVED DISPLAY PANEL

(71) Applicant: Samsung Display Co., Ltd., Yongin, Gyeonggi-Do (KR)

(72) Inventors: Joo Woan Cho, Seongnam-si (KR); Seung Kim, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 550 days.

(21) Appl. No.: 14/659,768

(22) Filed: Mar. 17, 2015

(65) Prior Publication Data

US 2016/0095205 A1    Mar. 31, 2016

(30) Foreign Application Priority Data

Sep. 25, 2014   (KR) .......................... 10-2014-0128256

(51) Int. Cl.
*H05K 1/02*   (2006.01)
*G02F 1/1333*   (2006.01)

(52) U.S. Cl.
CPC ...... *G02F 1/133308* (2013.01); *G02F 1/1333* (2013.01); *G02F 2201/503* (2013.01); *H05K 1/028* (2013.01)

(58) Field of Classification Search
None
See application file for complete search history.

(56) References Cited

U.S. PATENT DOCUMENTS

| | | | | |
|---|---|---|---|---|
| 2001/0033347 A1* | 10/2001 | Kitahora | ........... | G02F 1/133305 349/58 |
| 2005/0122464 A1* | 6/2005 | Lu | ..................... | G02F 1/133351 349/190 |
| 2013/0088662 A1* | 4/2013 | Watanabe | ......... | G02F 1/133308 349/58 |
| 2014/0009914 A1 | 1/2014 | Cho et al. | | |
| 2014/0226111 A1 | 8/2014 | Kim | | |
| 2014/0226112 A1* | 8/2014 | Kim | .................. | G02F 1/133305 349/96 |

FOREIGN PATENT DOCUMENTS

| | | |
|---|---|---|
| JP | 2000-206556 A | 7/2000 |
| JP | 2007-272107 A | 10/2007 |
| KR | 1020090115523 A | 11/2009 |
| KR | 1020130026286 A | 3/2013 |
| KR | 1020140007202 A | 1/2014 |
| KR | 1020140017161 A | 2/2014 |

* cited by examiner

*Primary Examiner* — Anthony J Frost
(74) *Attorney, Agent, or Firm* — Cantor Colburn LLP (57) ABSTRACT

A display device includes a display panel curved in a direction and a fixing frame having a predetermined curvature, where the fixing frame is configured to support and fix the curved display panel. The curved display panel includes curved first and second display substrates facing each other; and an elastic member on an edge portion of a rear surface of the curved first display substrate and elongated in the direction in which the display panel is curved. The curved first display substrate has a larger radius of curvature than that of the curved second display substrate.

11 Claims, 7 Drawing Sheets

DISPLAY DEVICE INCLUDING CURVED DISPLAY PANEL

This application claims priority to Korean Patent Application No. 10-2014-0128256, filed on Sep. 25, 2014, and all the benefits accruing therefrom under 35 U.S.C. § 119, the content of which is incorporated herein in its entirety by reference.

BACKGROUND

1. Field

Exemplary embodiments of the invention relate to a display device including a display panel curved in one direction, which is capable of reducing tensile stress exerted on the display panel.

2. Description of the Related Art

A display device is categorized into a liquid crystal display ("LCD"), an organic light emitting diode ("OLED") display, a plasma display panel ("PDP") and an electrophoretic display ("EPD") according to a method of emitting light.

Flat surface display devices are available in a wide range of screen sizes. Depending on positions from which a viewer sees a central portion of a screen or left and right end portions thereof, a visual disparity becomes disadvantageously larger as the screen size of display devices is increased. In other words, where a viewer sees an image displayed on a screen from a position corresponding to a central portion of a relatively large display device, the image displayed on a central portion of the screen is seen quite clearly, whereas the image displayed on left and right end portions of the screen is not clearly visible.

In order to compensate for the visual disparity, a curved surface display device has been developed, of which a surface is curved in a partial-circle profile extending from a central portion of a screen to each of opposing sides of the screen. The curved surface display device can be classified into two categories: a portrait type that has a longer vertical length than a horizontal length from the viewpoint of a viewer and is curved in a vertical direction, and a landscape type that has a longer horizontal length than a vertical length from the viewpoint of a viewer and is curved in a horizontal direction.

SUMMARY

In a method of manufacturing a curved surface display device, a display panel initially formed in a flat shape is coupled to a fixing frame formed in a curved shape in such a manner that the curved surface display device including a curved display panel is manufactured. The finally formed curved display panel is curved in accordance with the shape of the fixing frame, such that compressive stress occurs in an upper substrate of the display panel with respect to a neutral plane of the display panel, and tensile stress occurs in a lower substrate of the display panel with respect to the neutral plane of the display panel.

A glass substrate is generally utilized as the upper and lower substrates in a display panel. The glass substrate has a relatively high resistance to compressive stress, while having a very low resistance to tensile stress. Thus, the lower substrate within the initially flat-shaped display panel is likely to be broken or damaged by external forces in curving such display panel to manufacture the curved display panel.

One or more exemplary embodiment of the invention is directed toward a curved display device in which tensile stress exerted within a display panel is reduced to effectively prevent fracture of elements within the display panel.

According to an exemplary embodiment of the invention, a display device includes: a display panel curved in a direction and a fixing frame having a predetermined curvature, the fixing frame configured to support and fix the curved display panel. The curved display panel includes curved first and second display substrates facing each other; and an elastic member on an edge portion of a rear surface of the curved first display substrate and elongated in the direction in which the display panel is curved. The curved first display substrate has a larger radius of curvature than that of the curved second display substrate.

The elongated elastic member may include: a first elongated portion disposed facing the edge portion of the rear surface of the curved first display substrate, and a second elongated portion extended from the first elongated portion to be disposed facing side surfaces of the curved first and second display substrates, the side surfaces adjacent to the edge portion of the rear surface of the curved first display substrate.

The elongated elastic member may further include: a third elongated portion extended from the second elongated portion to be disposed facing an edge portion of a front surface of the curved second display substrate, the edge portion of the front surface adjacent to the side surfaces of the curved first and second display substrates.

The elastic member may include a relatively highly elastic metal or a polymer material with a relatively high elastic modulus.

The elastic metal may include at least one of aluminum (Al), copper (Cu), shape-memory alloy, nitinol, molybdenum (Mo), tungsten (W), spring-tempered stainless steel, elgiloy, hastalloy (hastelloy), β-titanium, and alloys thereof.

The elastic polymer material may include at least one of polyester-based silicone resins such as cyanoacrylate resin, epoxy resin, polyolefine, poly(methyl methacrylate) ("PMMA"), polyacrylate, polyacrylic acid, polyurethane, and/or polyethylene terephthalate ("PET").

The display panel may further include an adhesive member between the curved first display substrate and the elastic member.

The adhesive member may include at least one of thermosetting adhesive and an ultraviolet ("UV")-curable adhesive.

According to one or more exemplary embodiment of the invention, a display device includes an elastic member at a rearmost surface of a display panel on which tensile stress is exerted to reduce the tensile stress exerted on the display panel and thus reduce or effectively prevent fracture of the display panel.

The foregoing summary is illustrative only and is not intended to be in any way limiting the claims of the invention. In addition to the illustrative exemplary embodiments and features described above, further exemplary embodiments and features will become apparent by reference to the drawings and the following detailed description.

BRIEF DESCRIPTION OF THE DRAWINGS

The above and other features of the invention will be more clearly understood from the following detailed description taken in conjunction with the accompanying drawings, in which.

DETAILED DESCRIPTION

Advantages and features of the invention and methods for achieving thereof will be made clear from exemplary embodiments described below in detail with reference to the accompanying drawings. The invention may, however, be embodied in many different forms and should not be construed as being limited to the exemplary embodiments set forth herein. Rather, these exemplary embodiments are provided so that this disclosure will be thorough and complete, and will fully convey the scope of the invention to those skilled in the art. The invention is merely defined by the scope of the claims. Therefore, well-known constituent elements, operations and techniques are not described in detail in the exemplary embodiments in order to prevent the invention from being obscurely interpreted. Like reference numerals refer to like elements throughout the specification.

The spatially relative terms "lower," "upper" and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, where a device shown in the drawing is turned over, the device positioned "lower" another device may be placed "upper" another device. Accordingly, the illustrative term "lower" may include both the lower and upper positions. The device may also be oriented in the other direction, and thus the spatially relative terms may be interpreted differently depending on the orientations.

Throughout the specification, when an element is referred to as being "connected" to another element, the element is "directly connected" to the other element or "electrically connected" to the other element with one or more intervening elements interposed therebetween. It will be understood that when an element is referred to as being "on" another element, it can be directly on the other element or intervening elements may be present therebetween. In contrast, when an element is referred to as being "directly on" another element, there are no intervening elements present.

It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" can be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

According to an exemplary embodiment of the invention, a display device is a landscape type that has a longer horizontal length than a vertical length from the viewpoint of a viewer and that is curved in a horizontal direction, but is not limited thereto.

According to an exemplary embodiment of the invention, a display device includes a liquid crystal display ("LCD") panel, but is not limited thereto. The display device may include an organic light emitting diode ("OLED") display panel.

Further, according to an exemplary embodiment of the invention, a display device includes an edge-type backlight unit, but is not limited thereto. The display device may include a direct-type or corner-type backlight unit.

Figure 1:
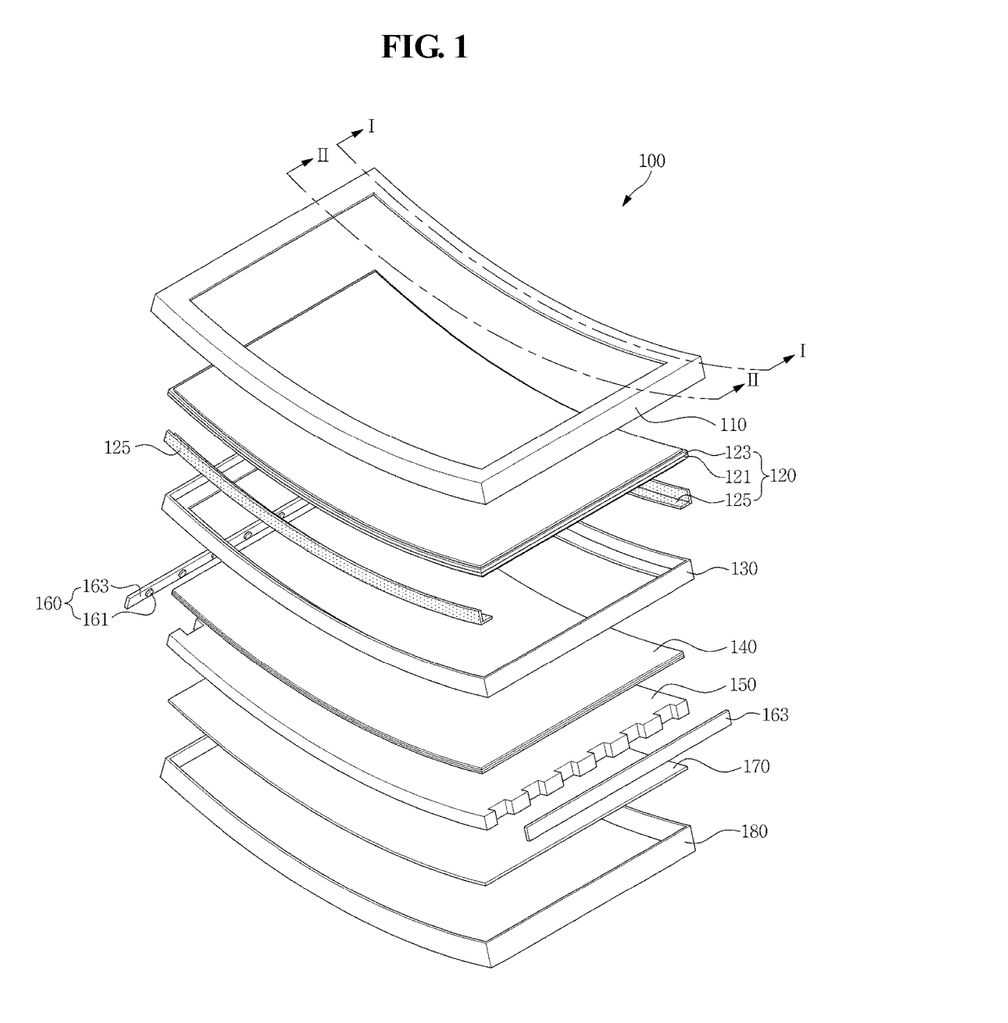
FIG. 1 is an exploded perspective view illustrating an exemplary embodiment of a display device according to the invention.
Figure 2:
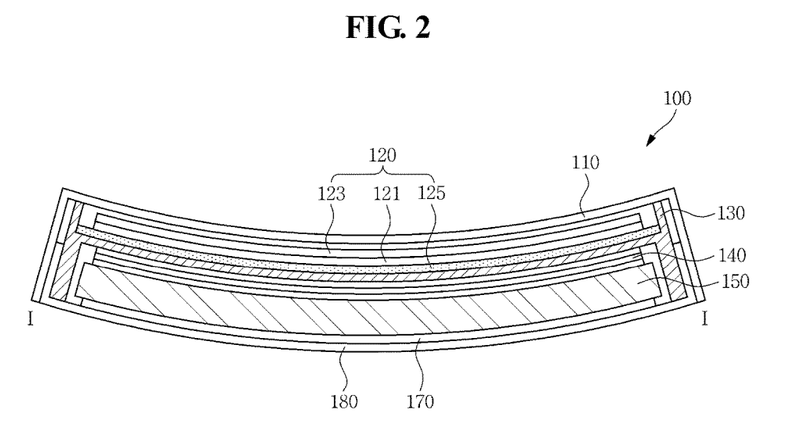
FIG. 2 is a cross-sectional view taken along line I-I of FIG. 1.
Figure 3:
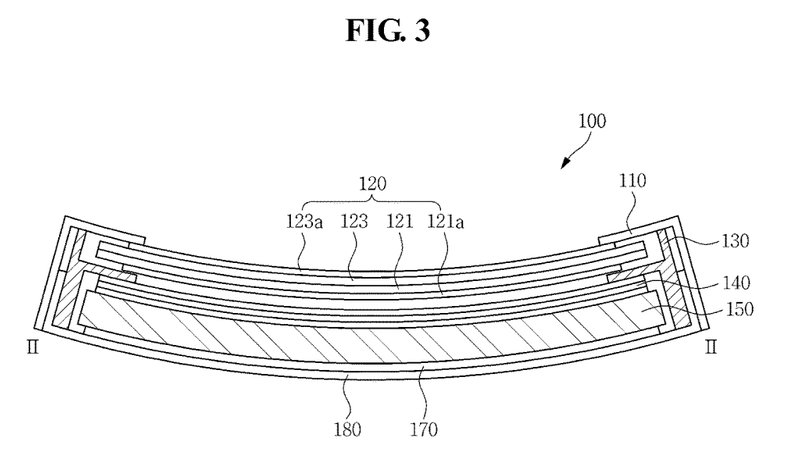
FIG. 3 is a cross-sectional view taken along line II-II of FIG. 1.

FIG. 1 is an exploded perspective view illustrating an exemplary embodiment of a display device according to the invention. FIG. 2 is a cross-sectional view taken along line I-I of FIG. 1. FIG. 3 is a cross-sectional view taken along line II-II of FIG. 1. According to one or more exemplary embodiment, a display device 100 is in landscape mode and includes an edge type backlight unit.

Referring to FIGS. 1 to 3, the display device 100 may include an upper frame (e.g., top chassis) 110, a display panel 120, an intermediate frame (e.g., mold frame), 130, an optical sheet 140, a light guide plate 150, a light source unit 160, a reflective sheet 170, and a lower frame (e.g., bottom chassis) 180. Hereinafter, the intermediate frame 130, the optical sheet 140, the light guide plate 150, the light source unit 160, the reflective sheet 170, and the lower frame 180 may collectively be included in a backlight unit according to one exemplary embodiment, but the invention is not limited thereto. One or more of the above enumerated components may be curved in a shape or profile to fit the overall curved surface of the curved display device.

A fixing frame such as the upper frame 110, the intermediate frame 130, or the lower frame 180 may be fabricated to have a predetermined curvature. That is, the fixing frame such as the upper frame 110, the intermediate frame 130, or the lower frame 180 may have a curved shape before being coupled to the display panel 120. The display panel 120 may have a curved shape before being coupled to the fixing frame, and may also be deformed from an initial non-curved form to be curved by the coupling thereof to the fixing frame.

In other words, where the display panel 120 is a flexible type display panel having flexibility, an initially flat display panel 120 may be curved by coupling thereof to the fixing frame. Where the display panel 120 is a rigid type display panel having negligible or no flexibility, the display panel 120 may be formed to have a predetermined curvature before being coupled to the fixing frame. In an exemplary embodiment, the display panel 120 is fabricated to be flat, and thereafter the initially flat display panel 120 can be formed to have a predetermined curvature by coupling thereof to the fixing frame. The fixing frame may have a radius of curvature in a range of about 1000 millimeters (mm) to about 5000 mm.

The upper frame 110 may have an open window defined therein and through which an active area of the display panel 120 is exposed outwards from the display device 100. The open window may be defined in the upper frame 110 such that remaining portions of the upper frame 110 cover (e.g., overlap) a side surface and an upper edge portion of a front surface of the display panel 120.

The upper frame 110 may be configured to fix the upper edge portion of the display panel 120 within the display device 100 so that the display panel 120 may not be detached from the backlight unit. The upper frame 110 may be fixed to the intermediate and lower frames 130 and 180. The upper frame 110 may be fixed to the intermediate and lower frames 130 and 180 utilizing hooks and/or screws, but the invention is not limited thereto.

The upper frame 110 may include a relatively hard metal material such as stainless steel and/or a heat dissipating material such as aluminum or an aluminum alloy. In an exemplary embodiment of manufacturing the display device 100, the upper frame 110 may be formed by a press molding process so as to have a predetermined curvature.

The display panel 120 may display an image using light and may be shaped like a quadrangular plate in a top plan view. The display panel 120 may be flexible such as to be curved in at least one direction. With reference to the quadrangular plate shape, two sides that are relatively long in length (hereinafter referred to as "long sides") may be concavely curved to have a predetermined curvature in a cross-sectional (e.g., thickness) view, whereas the other two sides that are relatively short in length (hereinafter referred to as "short sides") may be straight, e.g., not curved, in the cross-sectional (e.g., thickness) view. In an alternative exemplary embodiment, the display panel 120 may have long sides that are straight, and short sides that are concavely curved to have a predetermined curvature.

The display panel 120 may include a first display substrate 121, a second display substrate 123 that faces the first display substrate 121, and a liquid crystal layer (not shown) between the first and second display substrates 121 and 123. The first display substrate 121 may have a larger radius of curvature than the second display substrate 123.

Within the display panel 120 an elastic member 125 may be disposed on an edge portion of a rear surface of the first display substrate 121 and elongated along a direction in which the display panel 120 is curved. The elastic member 125 may be particularly disposed on an edge portion of a rear surface of the first display substrate 121 and elongated along a direction in which the first display substrate 121 is curved.

Referring to FIG. 1, the elongated elastic member 125 may extend to a side surface of the display panel 120, but is not limited thereto. The elastic member 125 may include a first portion disposed under the first and second display substrates 121 and 123 to face an edge portion of a rear surface of the first display substrate 121, and a second portion extended from the first portion to face a side surface of the first and second display substrate 121 and 123. The elastic member 125 may include only the first and second portions described above such that the elastic member 125 is disposed only on an edge portion of a rear surface of the first display substrate 121. The elastic member 125 may include the first and second portions described above, in addition to a third portion extended from the second portion and parallel to the first portion, such that the elastic member 125 may extend to be disposed at an edge portion of a front surface of the display panel 120, that is, on an upper surface of the second display substrate 123.

The elastic member 125 disposed at an edge portion of the rear surface of the display panel 120, reduces tensile stress exerted on the rear surface of the first display substrate 121. Further, the elastic member 125 extended to be disposed at a side surface of the display panel 120 and to also be disposed an edge portion of the front surface of the display panel 120, reduces tensile stress exerted on the rear surface of the first display substrate 121 and improves strength of the display panel 120. The elastic member 125 will be further described below.

The first display substrate 121 may include on a first base substrate (or plate), a plurality of pixel electrodes arranged in a matrix form, a thin film transistor ("TFT") configured to apply drive voltages to each of the plurality of pixel electrodes and signal lines configured to drive the plurality of pixel electrodes and the TFT.

The second display substrate 123 may be disposed to oppose (or face) the first display substrate 121, and may include on a second base substrate (or plate), a common electrode including a transparent conductive material and also include a color filter. Examples of the color filter may include red, green, and blue color filters, but the invention is not limited thereto.

The liquid crystal layer (not shown) may be interposed between the first and second display substrates 121 and 123 and may be rearranged by an electric field between the pixel electrode and the common electrode. The rearranged liquid crystal layer may adjust transmittance of light emitted from the backlight unit and the light of which the transmittance is adjusted may pass through the color filter in such a manner that an image is displayed outwards from the display panel 120.

Within the display panel 120, a lower polarizer 121*a* may be disposed on a rear surface of the first display substrate 121 and an upper polarizer 123*a* may be disposed on an upper surface of the second display substrate 123. The lower and upper polarizers 121*a* and 123*a* may have a planar area corresponding to the display panel 120 in a plan view. Among externally incident light, the upper polarizer 123*a* may pass light of only a specific polarization and may absorb or block light of other polarizations. Among light emitted from the backlight unit, the lower polarizer 121*a* may pass light of only a specific polarization and may absorb or block light of other polarizations.

A driver circuit board (not shown) may be disposed on a side of the display panel 120 so as to drive the display panel 120. The driver circuit board may provide control signals and power signals that drive the display panel 120.

The intermediate frame 130 may have a shape of a quadrilateral loop in a plan view. The intermediate frame 130 may be configured to support the display panel 120 and may also be configured to accommodate the optical sheet 140 and the light guide plate 150 therein. The intermediate frame 130 may be provided in a single unitary form, but may be provided to include plural separate portions which are assembled to form the intermediate frame 130.

The intermediate frame 130 may include a flexible material such as plastic in order to reduce or effectively prevent damage to the display panel 120. In an exemplary embodiment of manufacturing the display device 100, the intermediate frame 130 may be formed by an injection molding process so as to have a predetermined curvature.

The optical sheet 140 may be disposed on the light guide plate 150 and may act to diffuse or collimate light received from the light guide plate 150. The optical sheet 140 may include a collection of more than one sheet such as a diffusion sheet, a prism sheet and a protective sheet. The diffusion sheet, prism sheet and protective sheet may be sequentially laminated on the light guide plate 150 in the order in which they are enumerated.

The prism sheet may collimate light guided by the light guide plate 150, the diffusion sheet may diffuse the light collimated by the prism sheet, and the protective sheet may protect the prism sheet. Light passing through the protective sheet may be provided to the display panel 120.

The light guide plate 150 may uniformly distribute light received from the light source unit 160 to the display panel 120. The light guide plate 150 may be initially fabricated in a flat shape, and thereafter may be coupled to the curved fixing frame so as to have a predetermined curvature by such coupling thereof to the curved fixing frame. The light guide plate 150 may include a bendable material such that the light guide plate 150 may be initially fabricated in a flat shape, and thereafter deformed to have a predetermined curvature.

The light guide plate 150 may be provided in the form of, for example, a quadrangular plate having surfaces thereof be entirely flat, but is not limited thereto. In an exemplary embodiment where point light sources such as light emitting diode ("LED") chips are used as a light source, the light guide plate 150 may be formed in various shapes to have surfaces thereof including non-flat features such as predetermined grooves, protrusions, or the like defined therein according to the position of the light source.

The light guide plate 150 is described herein as a plate for ease of description, where a plate refers to a quadrangular member having a relatively large cross-sectional thickness.

In an exemplary embodiment, the light guide plate 150 may be provided in the form of a sheet or film to achieve slimness of a display device, where a sheet or film refers to a quadrangular member having a relatively small cross-sectional thickness. That is, in one or more exemplary embodiment of the invention, the light guide plate 150 configured to guide light may include not only a plate but may also include a film.

The light guide plate 150 may include a light-transmissive material, e.g., an acrylic resin such as polymethylmethacrylate ("PMMA") or polycarbonate ("PC"), so as to guide light relatively efficiently.

The reflective sheet 170 may be disposed between the light guide plate 150 and the lower frame 180. The reflective sheet 170 may reflect light emitted downwards from the light guide plate 150 towards the display panel 120, thereby increasing light efficiency of the display device 100.

Referring again to FIG. 1, the light source unit 160 may include a light source 161, and a circuit board 163 on which the light source 161 is disposed.

The light source 161 may be disposed at a corner portion, an edge portion and/or a light incident side of the light guide plate 150. That is, the light source 161 so disposed may respectively emit light to the corner portion, the edge portion and/or the light incident side of the light guide plate 150. The light source 161 may include at least one LED chip (not shown), and an LED package (not shown) configured to accommodate the at least one LED chip. In an exemplary embodiment, the LED chip (not shown) may be a gallium nitride (GaN) LED chip that emits blue light, but the invention is not limited thereto.

The number of light sources 161 may vary depending on the size, luminance uniformity and so on of the display panel 120. The circuit board 163 may be, for example, a printed circuit board ("PCB") or a metal core PCB.

Although not illustrated in FIG. 1, a wavelength conversion unit (not shown) may be disposed between a light incident surface of the light guide plate 150 and the light source unit 160. The wavelength conversion unit (not shown) may include a substance that converts a wavelength of incident light into a different wavelength of emitted. In an exemplary embodiment, for example, the wavelength conversion unit may convert a wavelength of incident blue light generated and emitted from a blue LED light source, into white light emitted from the wavelength conversion unit.

Although not illustrated in FIG. 1, a heat dissipation member (not shown) may be disposed between the light source unit 160 and the lower frame 180. The heat dissipation member may be configured to emit heat generated from the light source unit 160 to the outside the backlight unit and/or the display device 100. Where the light source unit 160 is disposed to be shaped like an elongated bar or line at a side surface of the lower frame 180, the heat dissipation member may be a metal frame having a shape of the elongated bar or line. As described above, the heat dissipation member may have a variety of shapes according to shapes of the light source unit 160.

The reflective sheet 170 may include as a base member, for example, polyethylene terephthalate ("PET") which may impart reflective properties. A surface of the base member of the reflective sheet 170 may be coated with a diffusion layer containing, for example, titanium dioxide. The reflective sheet 170 may also include a material containing a metal such as silver (Ag).

The lower frame 180 may be configured to maintain a shape of the display device 100 and to protect a variety of components disposed in a receiving space of the lower frame

180. The lower frame 180 may include a metal material having hardness such as stainless steel or a material having good heat dissipation properties such as aluminum or an aluminum alloy. In an exemplary embodiment of manufacturing the display device 100, the lower frame 180 may be formed by a press molding process so as to have a predetermined curvature.

Figure 4:
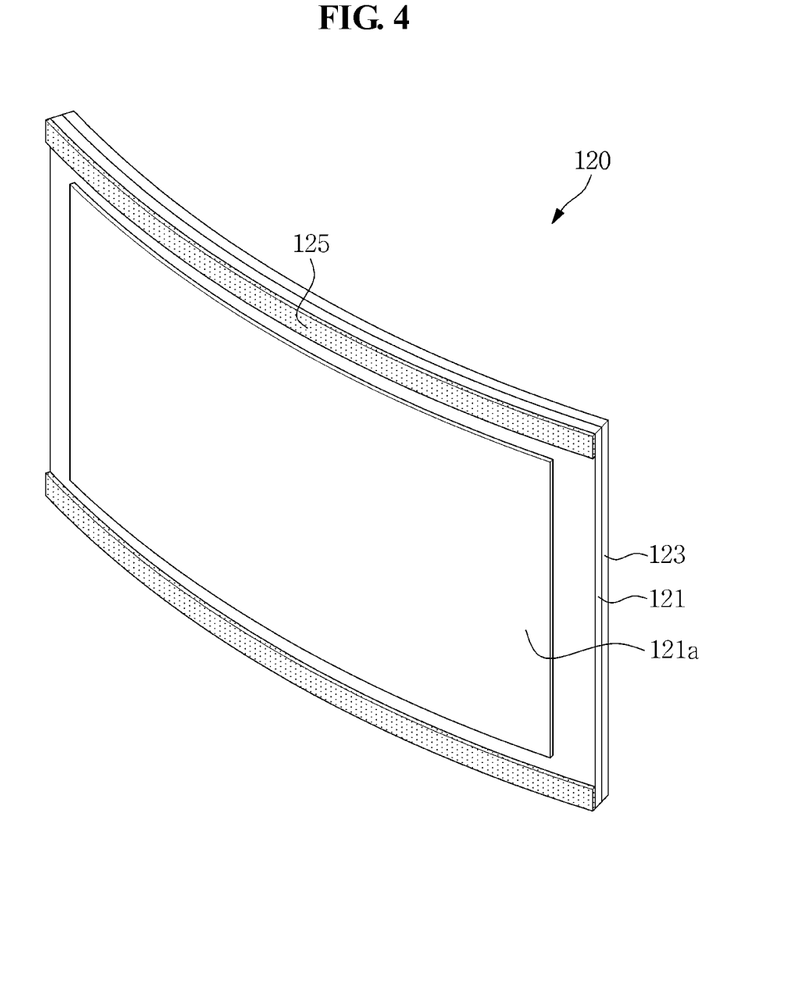
FIG. 4 is a perspective view illustrating an exemplary embodiment of a display panel according to the invention.

FIG. 4 is a perspective view illustrating an exemplary embodiment of a display panel according to the invention.

Referring to FIG. 4, the display panel 120 according to an exemplary embodiment of the invention may include first and second display substrates 121 and 123 that face each other, a liquid crystal layer (not shown) between the first and second display substrates 121 and 123, a lower polarizer 121a on a rear surface of the first display substrate 121, an upper polarizer (not shown) on an upper surface of the second display substrate 123, and an elastic member 125 on an edge portion of the rear surface of the first display substrate 121 along a direction in which the display panel 120 is curved.

The first display substrate 121 may have a larger radius of curvature than the second display substrate 123. That is, the display panel 120 may be concavely curved in such a manner that tensile stress may occur in the first display substrate 121 and compressive stress may occur in the second display substrate 123.

The elastic member 125 may be disposed on an edge portion of the rear surface of the first display substrate 121 in which tensile stress occurs, and elongated along a direction of curvature of the display panel 120. The elastic member 125 may be disposed at upper and lower end portions with respect to the long sides of the display panel 120. Further, the elastic member 125 may be curved to cover the edge portion of the rear surface of the first display substrate 121 and to also be disposed at a side portion of the display panel 120.

The elastic member 125 may include a relatively highly elastic metal or a polymer material with a relatively high elastic modulus.

In an exemplary embodiment according to the invention, for instance, the highly elastic metal includes, but is not limited to, aluminum (Al), copper (Cu), shape-memory alloy, nitinol, molybdenum (Mo), tungsten (W), spring-tempered stainless steel, elgiloy, hastalloy (hastelloy), β-titanium, and alloys thereof. In addition, any of a number of highly elastic metals having a relatively high elastic modulus may be utilized herein without limitation.

In an exemplary embodiment, for example, the polymer material may include, but is not limited to, polyester-based silicone resins such as cyanoacrylate resin, epoxy resin, polyolefine, PMMA, polyacrylate, polyacrylic acid, polyurethane, and/or PET. In addition, any of a number of polymer materials having a relatively high elastic modulus may be utilized herein without limitation.

In an exemplary embodiment of manufacturing the display device 100, the elastic member 125 may be fabricated by many different processes such as press working of the highly elastic metal or polymer material, extrusion molding, or injection molding.

The elastic member 125 may be bonded or tacked to the rear surface of the first display substrate 121 such as utilizing an adhesive member (not shown) or a tack member (not shown). The adhesive member may be thermosetting adhesive or ultraviolet ("UV") curable adhesive. The UV curable adhesive may include any of a number of monomers that are curable by UV light, a photoinitiator and a photopromoter, and may also include a solvent where necessary. Further, the UV curable adhesive may include liquid form glue.

In an exemplary embodiment of manufacturing the display device 100, the adhesive member or tack member may be coated while being in a liquid state or in a viscous state, and thereafter may be cured for a predetermined period of time or at a predetermined temperature. Therefore, the elastic member 125 may be firmly bonded to the first display substrate 121 utilizing the adhesive member or tack member with no separate apparatus. That is, the elastic member 125 may be bonded to the first display substrate 121 solely by the adhesive member or tack member.

Figure 5:
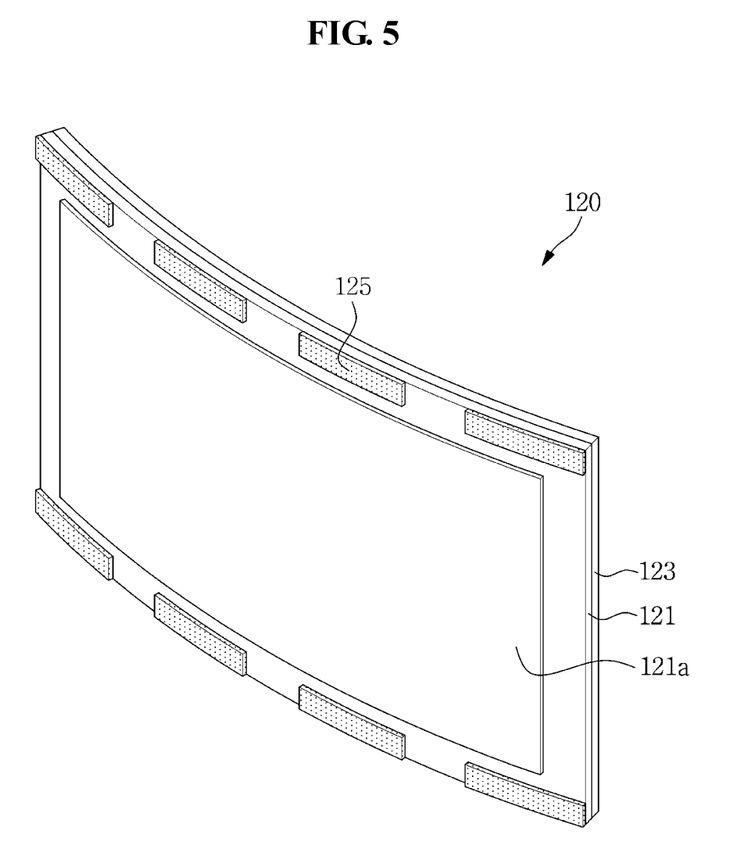
FIGS. 5 to 7 are perspective views illustrating other exemplary embodiments of a display panel according to the invention.
Figure 6:
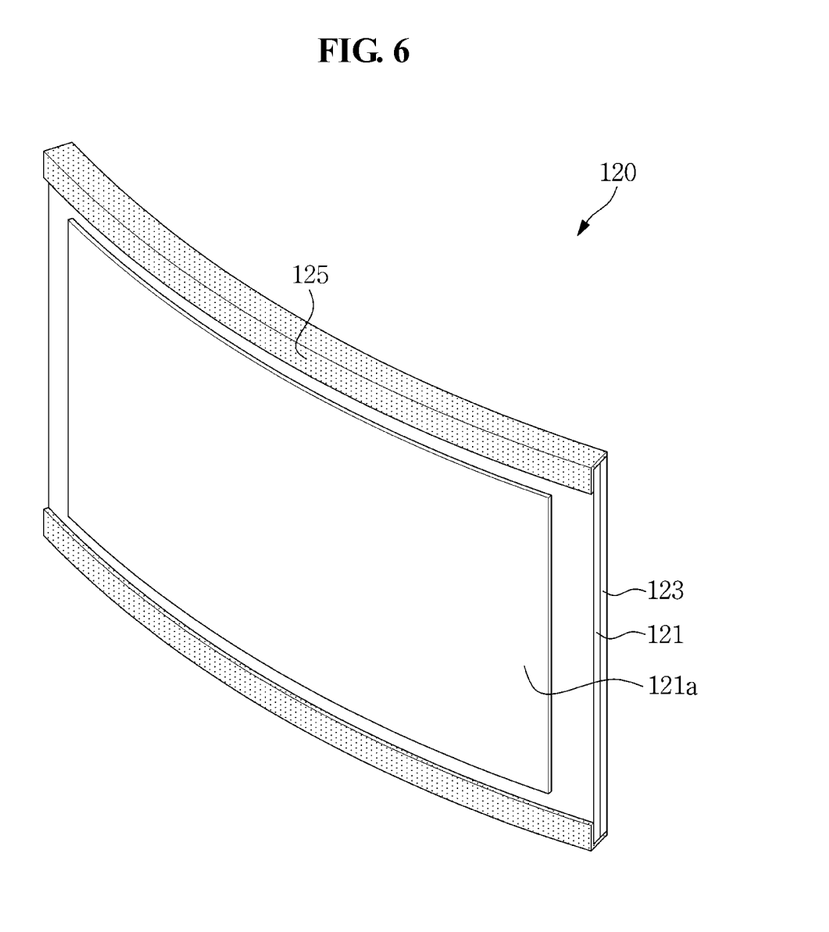
Figure 7:
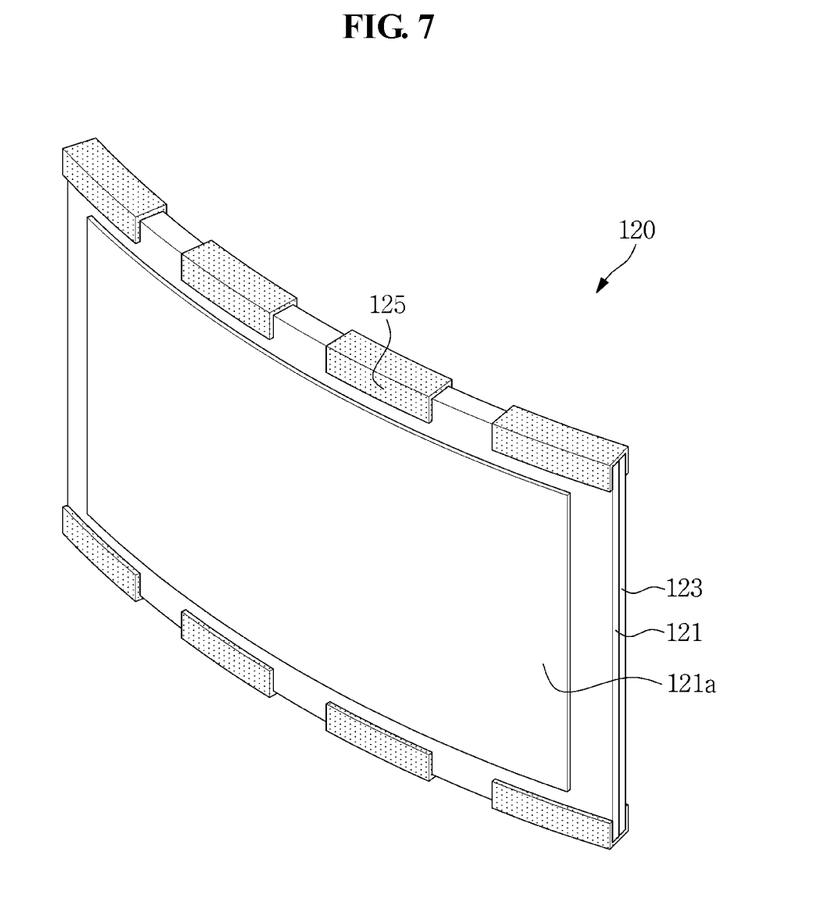

FIGS. 5 to 7 are perspective views respectively illustrating other exemplary embodiments of a display panel according to the invention. For convenience, a description of the display panel according to the other exemplary embodiments of the invention which is previously provided exemplary embodiment of the invention will not be repeated below.

Referring to FIGS. 5 to 7, each display panel according to the other exemplary embodiments of the invention includes first and second display substrates 121 and 123 that face each other, a liquid crystal layer (not shown) between the first and second display substrates 121 and 123, a lower polarizer 121a on a rear surface of the first display substrate 121, an upper polarizer (not shown) on an upper surface of the second display substrate 123, and an elastic member 125 on an edge portion of the rear surface of the first display substrate 121 and elongated along a direction in which the display panel 120 is curved.

The elastic member may include a collection of discrete elastic members 125 each on an edge portion of the rear surface of the first display substrate 121 (see FIG. 5), or may include a collection of discrete elastic members 125 each disposed on an edge portion of the rear surface of the first display substrate 121 and also extended to a sidewall (e.g., side surface) of the display panel 120 (see FIG. 6). Further, the elastic member may include a collection of discrete elastic members 125 each extended from an edge portion of the rear surface of the first display substrate 121 to a side surface of the display panel 120 and also to an edge portion of a front surface of the display panel 120 (see FIG. 7). The collection of discrete elastic members 125 may be disposed at opposing sides of the display panel 120 (see FIGS. 5-7), or may be disposed at only one side of the display panel 120.

Figure 8A:
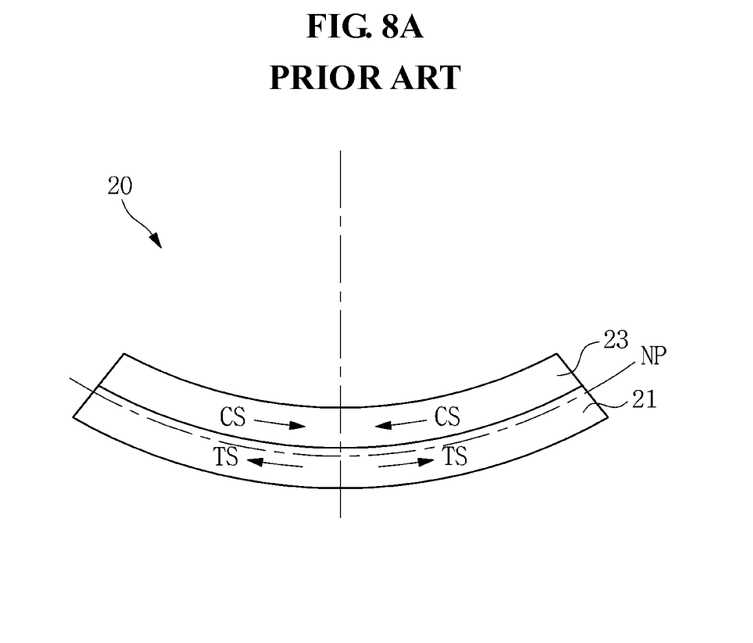
FIGS. 8A and 8B are diagrams respectively showing stress exerted on a conventional display panel and a display panel according to an exemplary embodiment of the invention.
Figure 8B:
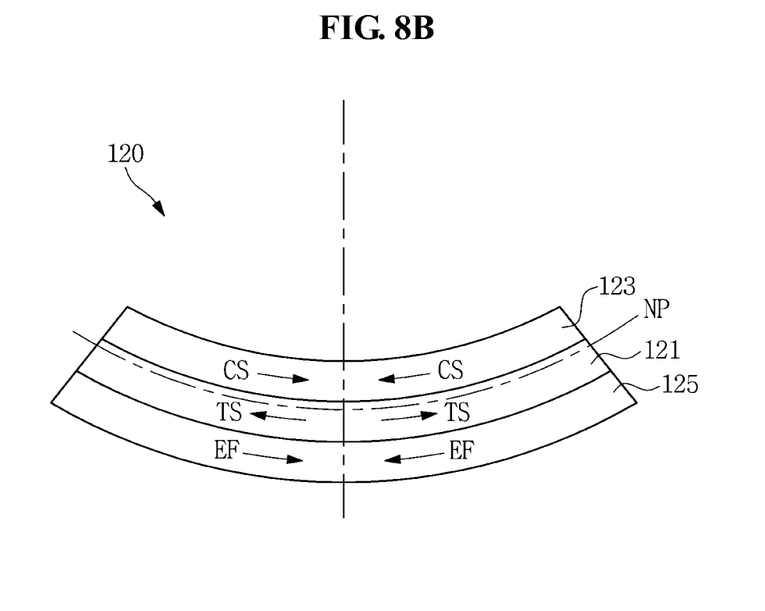

FIGS. 8A and 8B are diagrams respectively showing stress exerted on a conventional display panel and a display panel according to an exemplary embodiment of the invention.

A display device having a curved shape may be achieved by coupling an initially flat display panel to a curved fixing frame to define the curved shape. A predetermined external force may be exerted on the initially flat display panel in accordance with a curved shape of the curved fixing frame, and accordingly different types of stress may occur respectively in upper and lower base plates within the upper and lower display substrates of the display panel.

Referring to FIG. 8A, in a conventional display panel 20, a first display substrate 21 may be curved in an outwardly convex manner with respect to a neutral plane NP, and thus tensile stress TS may be exerted on the first display substrate 21, and a second display substrate 23 may be curved in an inwardly concave manner with respect to the neutral plane NP, and thus compressive stress CS may be exerted on the second display substrate 23. The neutral plane NP is a plane which does not contract or expand but maintains an original length when a member disposed relative thereto is bent under a certain force.

The base substrate (or plates) of the first and second display substrates 21 and 23 may include glass. A glass substrate has a relatively high resistance to compressive stress CS, but has a relatively very low resistance to tensile stress TS. Therefore, when an external force is applied to the display panel 20, the base substrate of the first display substrate 21 and/or other elements of the display substrate 21 in which the tensile stress TS occurs is likely to be broken.

Referring to FIG. 8B, in the display panel 120 according to an exemplary embodiment of the invention, the elastic member 125 is disposed on a rear surface of the first display substrate 121 in which tensile stress TS occurs. As the display panel 120 is curved, an elastic force EF may occur in the elastic member 125, where the elastic force EF allows an object to return to an initial shape after being deformed. The tensile stress TS occurring in the base substrate of the first display substrate 121 or in other elements of the display substrate 121 may be reduced due to the elastic force EF provided by the elastic member 125. The elastic force EF is extended in a direction opposite to that of the tensile stress TS. Since the elastic member 125 is attached to the display substrate 121, the elastic force EF of the elastic member 125 applies a force to the display substrate 121 opposite to that of the tensile stress TS applied to the display substrate 121.

Further, although cracks may appear in an edge portion of the first display substrate 121 due to the tensile stress TS occurring in the first display substrate 121, the adhesive member or tack member between the elastic member 125 and the first display substrate 121 may act to suppress an initially formed crack from growing.

From the foregoing, it will be appreciated that various exemplary embodiments of the invention have been described herein for purposes of illustration, and that various modifications may be made without departing from the scope and spirit of the disclosure. Accordingly, the various exemplary embodiments disclosed herein are not intended to limit the scope of the invention, and the true scope and spirit of the invention is indicated by the following claims, and equivalents thereof.

What is claimed is:
1. A display device comprising:
   a display panel curved in a direction, comprising:
      curved first and second display substrates facing each other; and
      an elastic member elongated in the direction in which the display panel is curved; and
      an adhesive member between the curved first display substrate and the elastic member;
   a fixing frame having a predetermined curvature, the fixing frame configured to support and fix the curved display panel,
   wherein
   the curved first display substrate has a larger radius of curvature than that of the curved second substrate, and
   the elongated elastic member comprises:
      a first elongated portion disposed facing a curved edge portion of the rear surface of the curved first display substrate, and
      a second elongated portion extended from the first elongated portion to be disposed facing curved side surfaces of the curved first and second display substrates, the curved side surfaces adjacent to the curved edge portion of the rear surface of the curved first display substrate.

2. The display device of claim 1, wherein the elongated elastic member further comprises:
   a third elongated portion extended from the second elongated portion to be disposed facing an edge portion of a front surface of the curved second display substrate, the edge portion of the front surface adjacent to the side surfaces of the curved first and second display substrates.

3. The display device of claim 1, wherein the elastic member comprises an elastic metal or an elastic polymer material.

4. The display device of claim 3, wherein the elastic metal comprises at least one of aluminum (Al), copper (Cu), shape-memory alloy, nitinol, molybdenum (Mo), tungsten (W), spring-tempered stainless steel, elgiloy, hastalloy (hastelloy), (β-titanium, and alloys thereof.

5. The display device of claim 3, wherein the elastic polymer material comprises at least one of cyanoacrylate resin, epoxy resin, polyolefine, poly(methyl methacrylate), polyacrylate, polyacrylic acid, polyurethane and/or polyethylene terephthalate.

6. The display device of claim 1, wherein the adhesive member comprises at least one of thermosetting adhesive and ultraviolet-curable adhesive.

7. The display device of claim 1, further comprising: a plurality of discrete elongated elastic members on the edge portion of the rear surface of the curved first display substrate and arranged in the direction in which the display panel is curved.

8. The display device of claim 7, wherein
   the curved first display substrate includes the edge portion of the rear surface thereof disposed at opposing sides of the curved display panel, and
   the plurality of elongated discrete elastic members is disposed at each of the edge portions respectively disposed at the opposing sides of the curved display panel.

9. The display device of claim 7, wherein each of the plurality of discrete elongated elastic members at a respective edge portion of the rear surface of the curved display panel comprises:
   a first elongated portion disposed facing the respective edge portion of the rear surface of the curved first display substrate, and
   a second elongated portion extended from the first elongated portion to be disposed facing side surfaces of the curved first and second display substrates, the side surfaces adjacent to the respective edge portion of the rear surface of the curved first display substrate.

10. The display device of claim 7, wherein the each of the plurality of elongated elastic members at the respective edge portion of the rear surface of the curved display panel further comprises:
   a third elongated portion extended from the second elongated portion to be disposed facing an edge portion of a front surface of the curved second display substrate, the edge portion of the front surface adjacent to the side surfaces of the curved first and second display substrates.

11. The display device of claim 1, wherein
   the curved first display substrate includes the edge portion of the rear surface thereof disposed at opposing sides of the curved display panel, and a single one of the elongated elastic member is discretely disposed at each of the edge portions respectively disposed at the opposing sides of the curved display panel.

* * * * *